(12) United States Patent  (10) Patent No.: US 7,634,396 B2
Zhivova et al.  (45) Date of Patent: Dec. 15, 2009

(54) METHOD AND COMPUTER PROGRAM PRODUCT FOR GENERATION OF BUS FUNCTIONAL MODELS

(75) Inventors: Lyubov Zhivova, St. Petersburg (RU); Sergey Korotkov, St. Petersburg (RU); Oleg Kruzhkov, St. Petersburg (RU); Igor Makhlushev, St. Petersburg (RU); Alexander Nekrasov, St. Petersburg (RU); Ivan Selin, Hoffman Estates, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 668 days.

(21) Appl. No.: 10/512,611

(22) PCT Filed: Apr. 25, 2002

(86) PCT No.: PCT/RU02/00195

§ 371 (c)(1),
(2), (4) Date: Feb. 21, 2006

(87) PCT Pub. No.: WO03/091951

PCT Pub. Date: Nov. 6, 2003

(65) Prior Publication Data

US 2006/0230364 A1  Oct. 12, 2006

(51) Int. Cl.
*G06F 9/45* (2006.01)
*G06F 17/50* (2006.01)
(52) U.S. Cl. .................. 703/22; 716/1; 716/4
(58) Field of Classification Search .......... 703/2, 703/22; 716/1, 4
See application file for complete search history.

(56) References Cited

U.S. PATENT DOCUMENTS 5,599,659 A  2/1997  Brasile et al.
5,787,008 A  7/1998  Pullela et al.
5,946,177 A  8/1999  Miller et al.

(Continued)

FOREIGN PATENT DOCUMENTS

EP  0 697 757 A1  2/1996

(Continued)

OTHER PUBLICATIONS

Luc Semeria, Abhijit Ghosh, "Methodology for Hardware/Software Co-verification in C/C++" IEEE ISBN 0-7803-5974-7, 2000, pp. 405-408.*

(Continued)

*Primary Examiner*—Paul L Rodriguez
*Assistant Examiner*—Dwin M Craig
(74) *Attorney, Agent, or Firm*—Joanna G. Chiu

(57) ABSTRACT

In accordance with the present invention, there is provided a method for creating a Bus Functional Model of an Integrated Circuit. The method comprises the following steps: providing (102) a detailed specification of said Integrated Circuit, defining (104) an architecture for said Bus Functional Model. In the following step data contained in the detailed specification of the Integrated Circuit are mapped (106) between the specification and the predefined BFM architecture. The BFM architecture contains at least one of the following constructs: Interface Tasks (202), Internal Data Elements (204), Processes (208), Finite State Machines (210), Conditions (206), Actions (212) and Signals (214). In the following step (110) the formal description of Bus Functional Model in Formal Description Language is created.

5 Claims, 2 Drawing Sheets

U.S. PATENT DOCUMENTS

| | | |
|---|---|---|
| 5,966,306 A | 10/1999 | Nodine et al. |
| 6,009,251 A | 12/1999 | Ho et al. |
| 6,442,514 B1 * | 8/2002 | Le .............................. 703/21 |
| 6,571,204 B1 * | 5/2003 | Meyer ........................ 703/22 |

FOREIGN PATENT DOCUMENTS

| RU | 2119188 C1 | 9/1998 |
|---|---|---|
| WO | WO 03/081742 A1 | 10/2003 |

OTHER PUBLICATIONS

Chonnad, Shivakumar et al.; "A Layered Approach to Behavioral Modeling of Bus Protocols"; IEEE; 2000; pp. 170-173; IEEE.

* cited by examiner

METHOD AND COMPUTER PROGRAM PRODUCT FOR GENERATION OF BUS FUNCTIONAL MODELS

TECHNICAL FIELD

The present invention relates to a method and a computer program product for generation of Bus Functional Models. In particular the invention is applicable to hardware/software integration, and verification of electronic hardware designs.

BACKGROUND

As improvements and development of integrated circuits result in miniaturization and complexity of the Integrated Circuits (IC) consideration has to be given to ensure that the ICs built in real hardware will function correctly. To avoid releasing products with errors that can lead to malfunctioning it is desirable to verify that the new device operates according to defined earlier functional specifications.

A standard method to provide such verification in the conventional technology is the one based on Bus Functional Model (BFM) approach. In this approach a synthesizable model of the IC, called Full Functional Model (FFM), is verified against the BFM that is a behavioural model of the same IC. FFM is also used to produce the IC itself. There are hardware simulators, known in the art (e.g. Verilog), that support such verification.

Another major application of BFM is using it to provide an early hardware/software integration and reduce the development time and debug the software even before the physical IC is ready. BFM can both generate and verify simulation vectors that are sent to and received from the simulated IC. In this approach it is verified how the software part works with other devices on the bus. The software communicates with other devices on the bus using the BFM that, in this case, is a layer between the software and the bus.

As mentioned earlier in the specification the Bus Functional Model (BFM) is a behavioural model, and is developed in Hardware Description Language (HDL) (one of the existing industry standard languages such as Verilog, VHDL, SystemC, etc.) that allows stimulating bus activity or an activity on any specified interface to IC, based upon given stimulus. A bus functional model typically interacts with an IC during a simulation by sending data to and receiving data from the IC. Stimuli are transferred to and from BFM using task based Application Program Interface (API) function calls. BFM can be used together with different simulation instruments. Usually BFM includes interface to bus functions as well as some functionality of the device that uses this interface.

BFM works as a bus interface unit. In the common approach it has two interfaces: bus pin interface and transaction task interface. Pin interface is used for communication with other bus devices according to the bus protocol. Transaction task interface is used for the execution of transactions that allow using special high level commands such as "READ" or "WRITE" which are translated into sequences of low-level signals in the pin interface. Such approach allows the model to generate different bus activities without execution of the whole program.

In methods known in the art the BFM code is developed according to three main inputs: IC Specification, HDL language, developers' experience. HDL language is taken as an instrument for creation of BFM through the analysis of the IC Specification applying the developers' experience in the area of modelling. There are no well-defined rules established for the interaction between these inputs. Therefore, each time BFM is created, the task of BFM design, the way of usage of IC Specification, and choice of the particular way of implementation is resolved individually according to the developer's team experience.

Results of such technique are several basic problems in the BFM development.

First, BFM structure is not formalized, thus the task of BFM development requires a deep knowledge on modelling and experience in BFM design.

Another big problem results form the fact that each time a BFM is being created, the architecture of it shall be developed again.

Yet another problem is that languages currently used for model development are not aimed for development of BFM as such and are not enough high-level. On the one hand they allow generating a wide range of different models (including BFMs) but on the other hand they are not very effective to produce BFMs in particular.

The above general problems lead to the following derivative problems of non-optimal code.

The code that is not strictly structured and not enough high-level, which is big and complex, potentially contains much more defects, and the efforts to locate these defects and resolve them consequently increase. The maintenance and modification of such code is also rather difficult.

Furthermore, not structured BFM code tends to be asynchronous. And one of the major problem of the asynchronous code is "signal racing". The "signal racing" problem occurs in situations when at the same simulation time a certain data element is set in one process and is being read in the other process. This leads to the situation when it is not guaranteed that the reading process will get correct value of the data element (it can be set and then read and also vice versa). This problem cannot be exposed during testing. The code may work correctly on the tests but may occasionally fail sometime when these two events are rescheduled in the simulator for some reason. So the behaviour of the model becomes unpredictable.

As this kind of defects cannot be revealed by tests with certainty (it may be unrepeatable or even not detected at all) the only reliable way to find and resolve this problem is the analysis of the code by means of code inspection. But these method is very expensive and effort consuming, especially if the code is big and complex.

BFM HDL code is dependant on the specific of the particular source language and is very difficult to transfer to another source language.

Additionally the code that is complex and not strictly structured is very difficult to be reused.

In the U.S. Pat. No. 5,920,711 a method of automatic generation of models specified by frame protocols is disclosed. The method proposes to specify the model by a Frame State Machines using visual tools and then the model HDL code may be automatically generated from it. The problem of this approach is that not every protocol may be easily specified by Frame State Machine and thus this method is not applicable (or hardly applicable) for the whole range of BFMs.

Hence, considering the above problems, better method of BFM development is needed. The new method should make it less effort consuming and reduce BFM code size and complexity.

SUMMARY OF THE INVENTION

There is a need for a method for generation of BFM and a computer program product which alleviate or overcome the disadvantages of the prior art. The method and the computer program product of the invention are preferably for use in hardware/software integration, and verification of electronic hardware designs.

In accordance with the present invention, there is thus provided a method for creating a Bus Functional Model of an Integrated Circuit. The method comprises the following steps: providing a detailed specification of said Integrated Circuit, in the next step an architecture for said Bus Functional Model is defined. In the following step data contained in the detailed specification of the Integrated Circuit are mapped between the specification and the predefined BFM architecture. The BFM architecture contains at least one of the following constructs: Interface Tasks, Internal Data Elements, Processes, Finite State Machines, Conditions, Actions and Signals. In the final step the formal description of Bus Functional Model in Formal Description Language (FDL) is created. The formal description is created in a computer readable form.

These steps described above can be performed both manually by the designer as well as by means of a computer.

The method further comprises the step of providing the formal description of the Bus Functional Model to a computer. To generate the BFM in particular target language, templates for such generation are then entered to said computer. Finally the Bus Functional Model source code in the target language is generated by applying said formal description on said templates.

In accordance with another aspect of the present invention there is thus provided a first computer program product stored on a computer usable medium, comprising computer readable program means for causing a computer to perform all the steps in accordance with the invention described herein.

In accordance with yet another aspect of the present invention there is thus provided a second computer program product stored on a computer usable medium, comprising computer readable program means, said computer program being result of performing all the steps in accordance with the invention described herein.

The method and the first computer program product according to the present invention allow generating of Bus functional Models, which can be used for verification of electronic hardware designs.

As a result of structurization of BFM the source code in target language is also structurized. Thanks to this formalized structure the source code of the BFM is not asynchronous and the problem of "signal racing" is eliminated. There are also other advantages of the invention that are results of the formal structurization. One of the basic advantages is 3 to 8 times reduced size of the source code. And reduced size of the code means that the number of defects and time necessary to resolve them is also significantly reduced.

Because of well defined structure of the BFM generated according to the present invention it is possible to reuse some parts of the generated BFM when the IC is further developed.

BRIEF DESCRIPTION OF THE DRAWINGS

The present invention will be understood and appreciated more fully from the following detailed description taken in conjunction with the drawings in which.

DETAILED DESCRIPTION OF THE PREFERRED EMBODIMENTS

Figure 1:
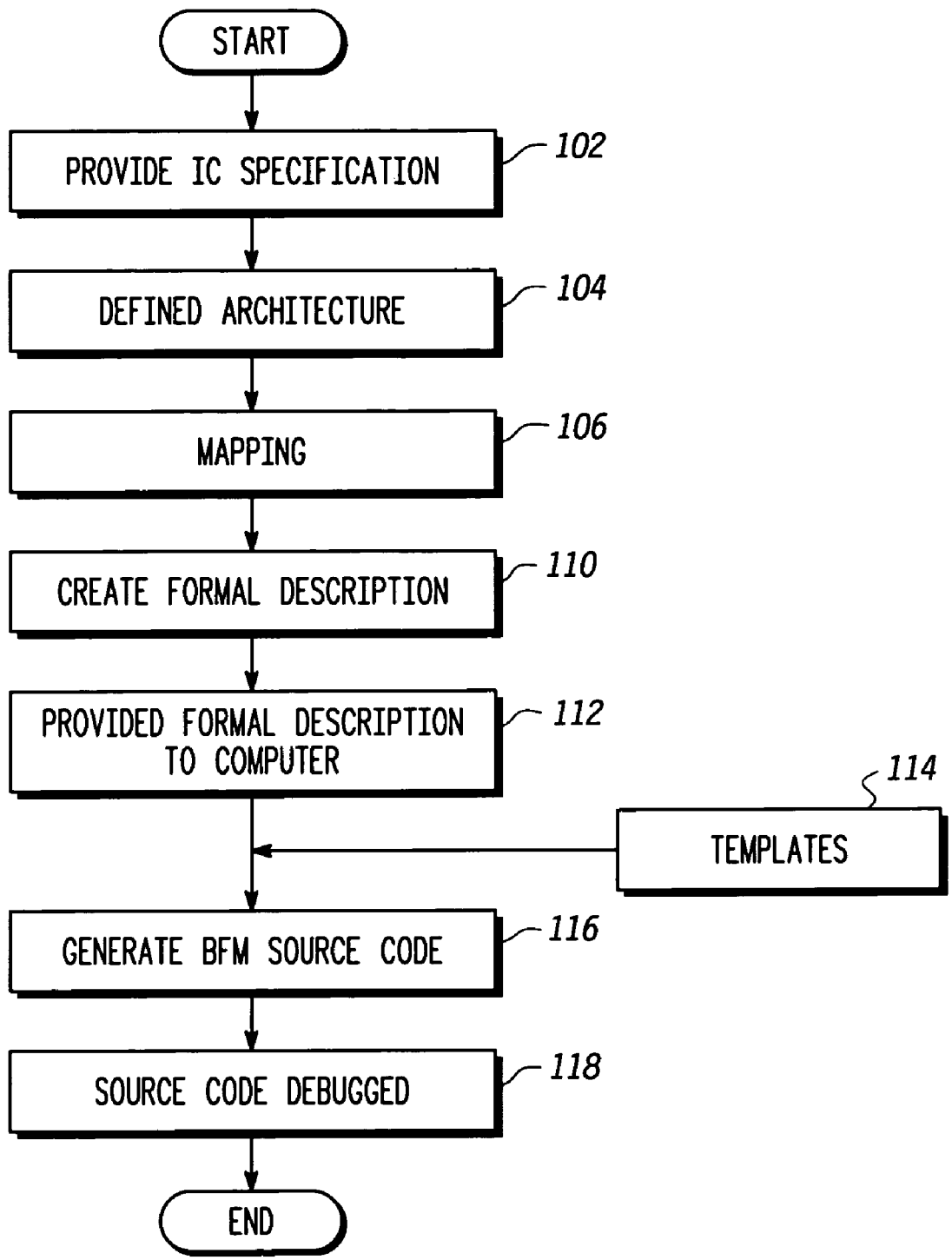
FIG. 1 is a flowchart illustrating the method of creating Bus Functional Models in accordance with an embodiment of the invention.

Terms used herein below will be easier understood when considered in connection with FIG. 2.

The term Interface Tasks 202 herein below refers to description of the interface between user and BFM.

The term Internal Data 204 herein below refers to description of the BFM system data. It has three main types of data elements:
 transaction table—it stores the data and status information for the separate bus transactions in the table form;
 queues—it is aimed at ordering the information in the transaction table. It stores the pointers to the separate lines of the table;
 registers—it stores the BFM global data (e.g. the BFM current state or configuration).

The term Processes 208 herein below refers to description of a BFM's active element that initiate all other BFM activity.

The following information can be specified for each Process 208:
 start condition used for the Process' 208 activation
 list of:
  Actions 212 to execute;
  Finite State Machines 210 to start;
  Finite State Machines 210 to terminate.

The lists are managed consequentially within the single Process 208, but different Processes 208 are executed concurrently.

The Process 208 can be in wait state and in execution state. At first, all the Processes 208 are in wait state. If the Process 208 is in wait state the Condition 206 is evaluated on each clock edge. If the Condition 206 is true, the Process 208 goes to execution state, the Actions 212 are executed and the Finite State Machines 210 are started and/or terminated.

The term Finite State Machines (FSM) 210 herein below refers to description of Actions 212 sequence. The sequence is a set of states and transitions between the states.

When an FSM 210 is being executed, the Condition 206 associated with the transition from the current state is evaluated on each clock edge, and if it is true the transition is executed and the associated Actions 212 are performed. The same is repeated for the next state, etc. Otherwise (if the current Condition 206 is false) the execution of the FSM 210 continues on the next clock edge.

FSM 210 can have the following types of conditional transitions:
 wait until a certain condition becomes true;
 wait for the next clock edge;
 branching according to the certain condition's value;
 unconditional transition;
 call of another FSM 210 (thus allowing nesting of FSM 210).

The term Conditions 206 herein below refers to description of expressions (used arithmetical and logical operations) with a true/false output. Condition 206 can be named to allow referring to it in other Conditions 206.

The term Actions 212 contains a set of operators used to:
 change contents of the Internal Data 204 construct activation of the Signals' 214 primitive Several operators in the Actions 212 construct can be grouped together and named, so this named Action 212 expands valid operators set.

The term Signals 214 herein below refers to description of BFM pin interface which is used to connect the BFM to an Integrated Circuit.

The following information can be specified for each signal: signal's outward form (name, dimension and direction) primitives for operating with the signal (signal timing).

Referring to FIG. 1 in step 102 a detailed specification of an IC is provided to create a BFM that describes the behaviour of this IC. In the step 104 an architecture of the BFM is to be defined. Then starts a process of mapping 106 between IC specification and predefined in step 104 architecture of the BFM. The predefined architecture contains at least one of the following constructs:

Interface Tasks (202),
Internal Data Elements (204),
Processes (208),
Finite State Machines (210)
Conditions (206),
Actions (212),
Signals (214).

Each of the defined constructs interacts with other constructs and the relations between them are explained with reference to FIG. 2.

Interface Task construct 202 interacts with Internal Data construct 204 by setting/getting its content.

Internal Data construct 204 interacts with Actions 212 and Task Interface 202 constructs by providing an interface (a set of operators) for data setting/getting and by providing data values to them. Internal Data construct 204 interacts also with Conditions construct 206 by providing data values to it.

Conditions construct 206 interacts with Processes 208, FSMs 210 and Signals 214 constructs by providing conditions for evaluation. This construct also interacts with Internal Data 204 and Signals 214 constructs by getting their data values to use as operands.

Actions construct 212 interacts with Internal Data construct 204 by modification of its content, with Signals construct 214 by activation of the primitives, and with Processes 208, FSMs 210 constructs by providing a set of operators for execution.

Signals construct 214 interacts with Actions construct 212 by providing primitives as a valid Actions' 212 operators and with Conditions 206 construct by providing data values to it.

FSMs construct 210 interacts with Conditions construct 206 by evaluating its values, with Actions construct 212 by executing its operators and with Processes construct 208 by causing FSMs to be started or interrupted.

Processes construct 208 interacts with Conditions construct 206 by evaluating its values and with Actions construct 212 by executing its operators as well as with FSM construct 210 by starting/terminating them.

Figure 2:
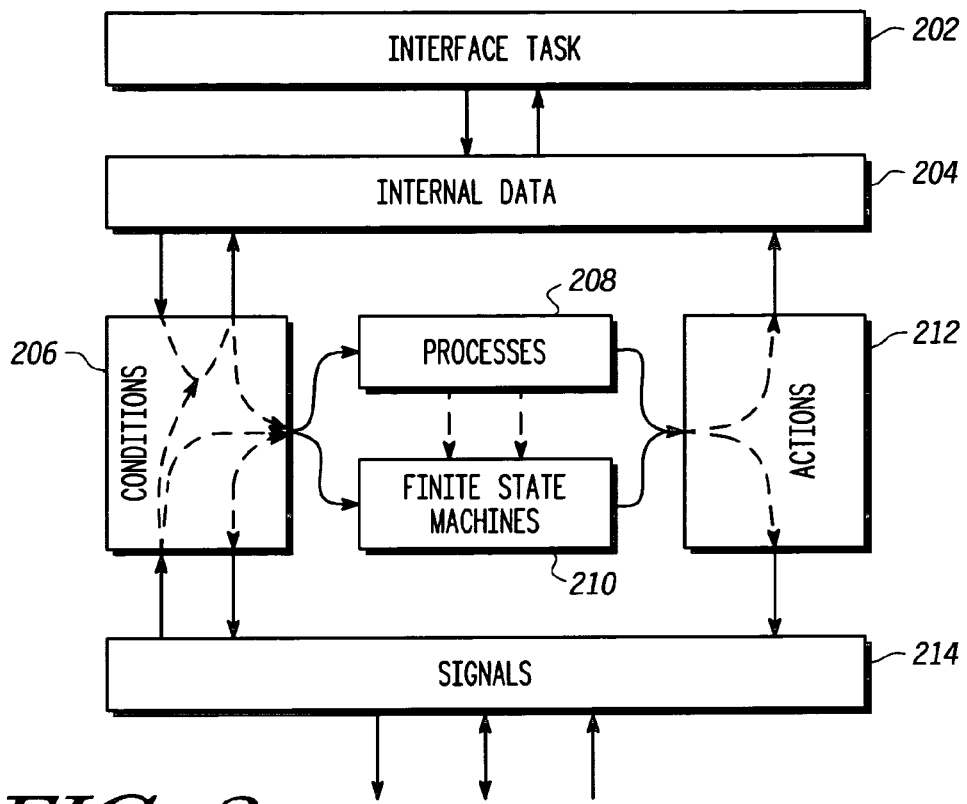
FIG. 2 is a schematic illustration of the architecture of the Bus Functional Model of an Integrated Circuit and relations between its constructs in accordance with an embodiment of the invention.
Figure 3:
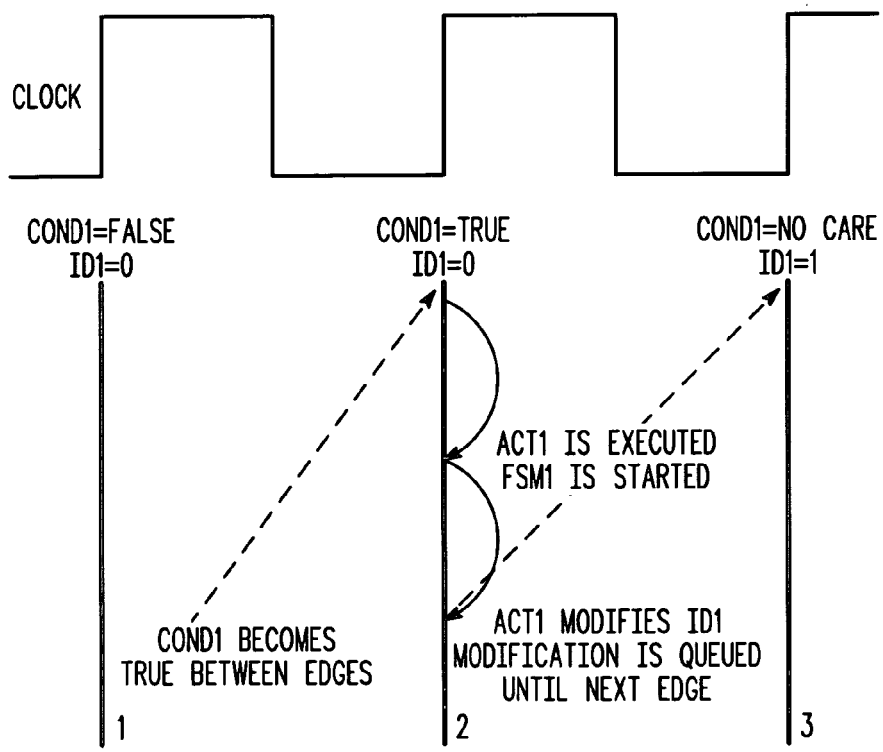
FIG. 3 is a timing diagram illustrating time dependencies of constructs' interactions in accordance with an embodiment of the invention.

Time dependencies of the constructs' interactions are presented with reference to FIGS. 2 and 3. A Process (of the Processes construct 208) illustrated on FIG. 3 has:

COND1 as a start condition (of the Conditions construct 206),
ACT1 as an action (of the Actions construct 212) and
FSM1 as an FSM to execute (of the FSM construct 210.

Between clock edges 1 and 2 COND1 becomes true and this let the Process 208 starts on the clock edge 2, when its start Condition 206 is true. The Actions 212 are made on the clock edge 2 but the results are visible only on the clock edge 3. If there is a Condition (of the Conditions construct 206) like (ID1=1) it would be true on clock edge 3 and yet false on clock edge 2.

Similarly, the FSM 210 starts working on the clock edge 2. The Condition 206 on the transition from the starting state is checked on the clock edge 2 and if true, the transition is executed on the clock edge 2. All the Actions 212 made are visible only on the clock edge 3. The next transition(s) are checked on the same clock edge 2 until some Condition 206 is false and the corresponding transition is blocked.

All the modifications made while executing the transitions are queued and actually made so as to be visible only on the clock edge 3.

With reference to FIG. 1, during the process of mapping 106 a data from the specification are allocated to respective construct (202-214) depending on what the data is related to. For example the data related to description of expressions (using arithmetical and logical operations) with a true/false output are allocated to Conditions 206 construct. Same way data related to description of a set of states and transitions between states are allocated to Finite State Machine 210 construct. In the step 110 a formal description of the Bus Functional Model is created in FDL, in computer readable form.

The FDL is a BFM-oriented high-level language that incorporates the general BFM architecture. The FDL can be used to express whole BFM structure or separate aspects of the BFM operation. The FDL operates with the constructs that are used to specify the BFM. The interaction of these constructs is also organized in a predefined way that provides such features of the FDL as full synchronization and strict structure, and well-defined purpose of each construct. The full synchronization makes possible elimination of the problem of "signal racing". There are also a set of special data structures incorporated in the FDL that allows to specify easily different BFM queues, transactions etc. The FDL used for description of the BFM according to the present invention was developed by the applicant. The FDL consists of a number of elements and the most important ones are presented in the Table I as an example only.

TABLE I

| FDL element | Grammar Rule |
| --- | --- |
| Handle | handle_specifier ::=<br>    <queue_name>.Get(<numeral_expression>)<br>    \| <queue_name>.First<br>    \| <queue_name>.Last<br>    \| r: <register_name><br>    \| handle<br>    \| name of tenure local variable |
| Internal Data | data_specifier ::=<br>    s:<signal_name><br>    \| p:<parameter_name>(<handle_specifier>)<br>    \| <queue_name>.rq_count<br>    \| <handle_specifier><br>    \| l:<local_parameter_name> |
| Numeral Value | numeral_value ::=<br>    number<br>    \| <data_specifier> |
| Numeral Expression | numeral_expression ::=<br>    any numerical operations under<br>    <numeral_value> |
| Comments | comments ::=<br>    // any text comments here \n<br>    \| /*<br>    any text comments here<br>    */ |
| Macro Definition | macro ::=<br>    m:<macro_name>(<parameter_1_value>,<br>    <parameter_2_value>, ...) |

TABLE I-continued

| FDL element | Grammar Rule |
| --- | --- |
| Condition | condition ::=<br>    <numeral_expression> relational operator<br>    <numeral_expression><br>    \| IsSet (<handle_specifier>)<br>    \| IsAsserted (<data_name>)<br>    \| IsNegated (<data_name>)<br>    \| <condition> logical operator <condition><br>    \| c:<name_of_named_condition> |

Referring to FIG. 1 the method further comprises the step in which said formal description in computer readable form is provided 112 to the computer. Then, the templates that defines the rules of generation of BFM in particular target language are provided 114 to this computer. In the step 116 the computer generates a source code of the BFM in the target language by applying the formal description on the templates. In the last step 118 the BFM source code is debugged.

The method in accordance with the present invention may be used for generating Bus Functional Models of different Integrated Circuits. In particular, the invention is usable in simulating bus activity or an activity of any specified interface to IC, based upon given stimulus. Therefore the method may be used in hardware/software integration, and verification of electronic hardware designs.

It will be understood that the invention tends to provide the following advantages singly or in any combination:
- by generating a code that is synchronous the problem of signal racing is eliminated;
- source code of the BFM is significantly reduced in comparison with the one produced by means of prior art methods;
- by reducing the code size also the number of errors is significantly reduced;
- structurized form of the code make debugging easier and additionally some parts of the code can be reused when the IC is further developed.

The invention claimed is:

1. A method of creating a Bus Functional Model of an Integrated Circuit wherein said method comprising the steps of:
   (a) providing (102) a detailed specification of said Integrated Circuit,
   (b) defining (104) an architecture for said Bus Functional Model,
   (c) mapping (106) between said Integrated Circuit specification and said defined Bus Functional Model architecture wherein said Bus Functional Model architecture contains at least one of the following constructs:
   Interface Tasks (202),
   Internal Data Elements (204),
   Processes (208),
   Finite State Machines (210),
   Conditions (206),
   Actions (212),
   Signals (214),
       wherein the step of mapping comprises allocating a data from said Integrated Circuit specification to a respective construct of the at least one of the constructs, depending on what the data is related to,
   (d) Creating (110) formal description of said Bus Functional Model in a Formal Description Language in a computer readable form;
   wherein said Integrated Circuit specification is provided to a computer in computer readable form and steps (b) to (d) are performed automatically in said computer.

2. A method according to claim 1 further comprising the steps:
   (e) providing (112) said formal description of said Bus Functional Model (BFM) in a computer readable form to a computer;
   (f) providing (114) templates for generation of BFM in particular target language to said computer;
   (g) generating (116) BFM source code in said target language by applying said formal description on said templates;
   wherein steps (b) to (d) are performed automatically in said computer.

3. A method according to claim 2 further comprising the step of debugging (118) said BFM source code.

4. A method according to claim 1 wherein said formal description of said Bus Functional Model is synchronous and eliminates signal racing.

5. A computer program product stored on a computer usable medium, comprising computer readable program means for causing a computer to perform all the steps of the method according to claim 1.

\* \* \* \* \*